(12) United States Patent
Shi et al.

(10) Patent No.: US 10,130,004 B2
(45) Date of Patent: Nov. 13, 2018

(54) NETWORK DEVICE

(71) Applicant: Huawei Technologies Co., Ltd., Shenzhen (CN)

(72) Inventors: Lei Shi, Shenzhen (CN); Dongqing Zhang, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/921,536

(22) Filed: Oct. 23, 2015

(65) Prior Publication Data

US 2016/0120062 A1    Apr. 28, 2016

(30) Foreign Application Priority Data

Oct. 24, 2014    (CN) .......................... 2014 1 0577677

(51) Int. Cl.
*H05K 7/20*          (2006.01)
*G06F 1/20*          (2006.01)
*H05K 7/14*          (2006.01)

(52) U.S. Cl.
CPC ........... *H05K 7/20136* (2013.01); *G06F 1/20* (2013.01); *H05K 7/1422* (2013.01); *H05K 7/20736* (2013.01)

(58) Field of Classification Search
CPC .......... H05K 7/20136; H05K 7/20736; H05K 7/1422; G06F 1/20
See application file for complete search history.

(56) References Cited

U.S. PATENT DOCUMENTS 6,341,064 B1    1/2002   Bradley
6,690,575 B1 *   2/2004   Banton .............. H05K 7/20727
                                                 165/122
(Continued)

FOREIGN PATENT DOCUMENTS

CN          202535386 U    11/2012
CN          103796475 A     5/2014
(Continued)

OTHER PUBLICATIONS

Foreign Communication From a Counterpart Application, European Application No. 15184170.7, Extended European Search Report dated Feb. 3, 2016, 10 pages.
(Continued)

*Primary Examiner* — Hoa C Nguyen
*Assistant Examiner* — Christopher L Augustin
(74) *Attorney, Agent, or Firm* — Conley Rose, P.C.

(57) ABSTRACT

A network device includes a shelf in which a first accommodation area, a second accommodation area, a first channel, and a second channel are disposed. A third channel is formed between adjacent rear board modules or between the rear board module and the shelf. A first fan and a second fan are both disposed at a rear end of the shelf, the first fan faces the third channel, and the second fan faces the second channel. A first airflow sequentially passes, from a front end of the shelf, through the front board module in the first accommodation area, the third channel, and the first fan to form a first heat dissipation channel. A second airflow sequentially passes through the inside of the rear board module, the second channel, and the second fan after entering the first channel from the outside of the shelf to form a second heat dissipation channel.

4 Claims, 3 Drawing Sheets

(56) References Cited

U.S. PATENT DOCUMENTS

| | | | | |
|---|---|---|---|---|
| 6,927,975 | B2* | 8/2005 | Crippen | G06F 1/183 312/223.1 |
| 7,113,401 | B2* | 9/2006 | Becker | G06F 1/183 165/122 |
| 7,643,307 | B2* | 1/2010 | Bosco | G06F 1/189 361/600 |
| 7,804,684 | B1* | 9/2010 | Aybay | H05K 7/1445 312/236 |
| 7,826,222 | B2* | 11/2010 | Aybay | H05K 7/20563 361/694 |
| 8,064,200 | B1* | 11/2011 | West | H05K 7/20563 361/694 |
| 8,767,400 | B2* | 7/2014 | Dickinson | F04D 25/166 165/104.33 |
| 8,854,814 | B2* | 10/2014 | Liu | H05K 7/20736 361/695 |
| 9,215,831 | B2* | 12/2015 | Hao | H05K 7/20554 |
| 2002/0012235 | A1* | 1/2002 | Kupnicki | H05K 7/1425 361/785 |
| 2006/0000353 | A1* | 1/2006 | Campini | B01D 51/08 95/29 |
| 2012/0120596 | A1* | 5/2012 | Bechtolsheim | H05K 7/20572 361/679.48 |
| 2012/0327597 | A1 | 12/2012 | Liu et al. | |
| 2013/0107452 | A1* | 5/2013 | Qu | G06F 1/20 361/692 |
| 2015/0036287 | A1* | 2/2015 | Ross | H05K 7/20736 361/679.48 |
| 2016/0095262 | A1* | 3/2016 | Ding | H05K 7/1445 361/679.49 |

FOREIGN PATENT DOCUMENTS

| | | |
|---|---|---|
| EP | 2146563 A1 | 1/2010 |
| EP | 2590492 A1 | 5/2013 |

OTHER PUBLICATIONS

Partial English Translation and Abstract of Chinese Patent Application No. CN202535386, Dec. 4, 2015, 4 pages.
Machine Translation and Abstract of Chinese Publication No. CN103796475, May 14, 2014, 8 pages.
Foreign Communication From a Counterpart Application, Chinese Application No. 201410577677.1, Chinese Office Action dated Aug. 24, 2017, 6 pages.
Foreign Communication From a Counterpart Application, European Application No. 15184170.7, European Result of Consultation dated Jun. 18, 2018, 5 pages.

* cited by examiner

NETWORK DEVICE

CROSS-REFERENCE TO RELATED APPLICATION

This application claims priority to Chinese Patent Application No. 201410577677.1, filed on Oct. 24, 2014, which is hereby incorporated by reference in its entirety.

TECHNICAL FIELD

The present disclosure relates to the field of heat dissipation of network devices, and in particular, to a heat dissipation architecture of a network device.

BACKGROUND

An internal architecture of a network device is that a front board module is disposed in the front, a rear board module orthogonal to the front board module is disposed in the rear, and a backplane is disposed between the front and rear board modules. Signal transmission is implemented by using the backplane. The front board module is placed vertically, the rear board module is placed horizontally, and the backplane is disposed between the front board module and the rear board module. A rear end of the network device further includes a fan, to dissipate heat for the front and rear board modules. Because a heat dissipation air duct of the front board module is blocked by the backplane, air flows to a periphery of the backplane, bypasses the backplane, and is finally sucked out of the network device by the fan after passing through the rear board module.

This heat dissipation architecture has the following disadvantages: a backplane between front and rear board modules blocks ventilation between the front and the rear board modules. As a result, the network device has complex air ducts and many turns, and heat dissipation effect is poor, which is especially not beneficial to heat dissipation of the rear board module. Because air for dissipating heat from the rear board module first passes through the front board module, cascading heating exists, that is, heat from the front board module is brought to an area of the rear board module. Therefore, the rear board module works in a high temperature environment for a long time, and is easily damaged, and a service life is reduced.

SUMMARY

The present disclosure resolves a technical problem that internal space of a network device has complex air ducts and heat dissipation effect is poor, so as to improve a service life of a product.

To achieve the foregoing objective, implementation manners of the present disclosure provide the following technical solutions The present disclosure provides a network device, including a shelf, at least one front board module, at least one rear board module, a plurality of orthogonal connectors, a first fan, and a second fan; where a first accommodation area, a second accommodation area, a first channel, and a second channel are disposed in the shelf, the first accommodation area and the second accommodation area are close to a front end and a rear end of the shelf respectively and communicate with each other, the first channel and the second channel are located on two sides of the second accommodation area separately, and the first channel and the second channel are both isolated from the first accommodation area and the second accommodation area, the front board module is disposed in the first accommodation area, the rear board module is disposed in the second accommodation area, and the front board module and the rear board module are electrically connected and are distributed in the shelf in an orthogonal manner, a third channel is further disposed in the shelf, and the third channel is disposed between the two adjacent rear board modules or between the rear board module and the shelf, and communicates with the first accommodation area, the first fan and the second fan are both disposed at the rear end of the shelf, the first fan faces the third channel, and the second fan faces the second channel, and an airflow sequentially passes, from the front end of the shelf, through the front board module in the first accommodation area, the third channel, and the first fan to form a first heat dissipation channel, an airflow sequentially passes through the inside of the rear board module, the second channel, and the second fan after entering the first channel from the outside of the shelf, to form a second heat dissipation channel, and the first heat dissipation channel and the second heat dissipation channel are independent of each other.

The first channel extends from the front end of the shelf to one side of the rear board module, and the second channel extends from the other opposite side of the rear board module to the second fan located at the rear end of the shelf.

The shelf is provided with a ventilation opening, the ventilation opening enables the second accommodation area to directly communicate with the outside of the shelf, and the first channel is located between the ventilation opening and the rear board module.

Each rear board module includes a housing and a circuit board accommodated in the housing, the housing is provided with an air inlet and an air outlet, the air inlet faces the first channel, the air outlet faces the second channel, and the housing isolates the circuit board from the second accommodation area.

The network device further includes at least one orthogonal connector, and the orthogonal connector is connected between the front board module and the rear board module, to implement data transmission between the front board module and the rear board module.

The network device further includes a backplane, the backplane is used to implement electrical connection between the front board module and the rear board module, the backplane is provided with an air guiding opening, and the first accommodation area communicates with the third channel by using the air guiding opening.

In the network device provided in the present disclosure, a first fan is used for separately dissipating heat from a front board module. Because the front board module and a rear board module are connected by using an orthogonal connector or a backplane having an air guiding opening, an airflow directly enters a third channel from the front board module without being blocked, so that a first heat dissipation channel is simple, thereby improving a heat dissipation capability. The first heat dissipation channel and a second heat dissipation channel are designed to be independent of each other, and a second fan separately dissipates heat from the rear board module and has a good heat dissipation capability, so that the rear board module can work in an environment with an appropriate temperature, thereby improving a service life of the rear board module, and further ensuring reliability of the network device.

BRIEF DESCRIPTION OF DRAWINGS

To describe the technical solutions in the present disclosure more clearly, the following briefly introduces the accompanying drawings required for describing the implementation manners. The accompanying drawings in the following description show merely some implementation manners of the present disclosure, and a person of ordinary skill in the art may still derive other drawings from these accompanying drawings without creative efforts.

DESCRIPTION OF EMBODIMENTS

Figure 1:
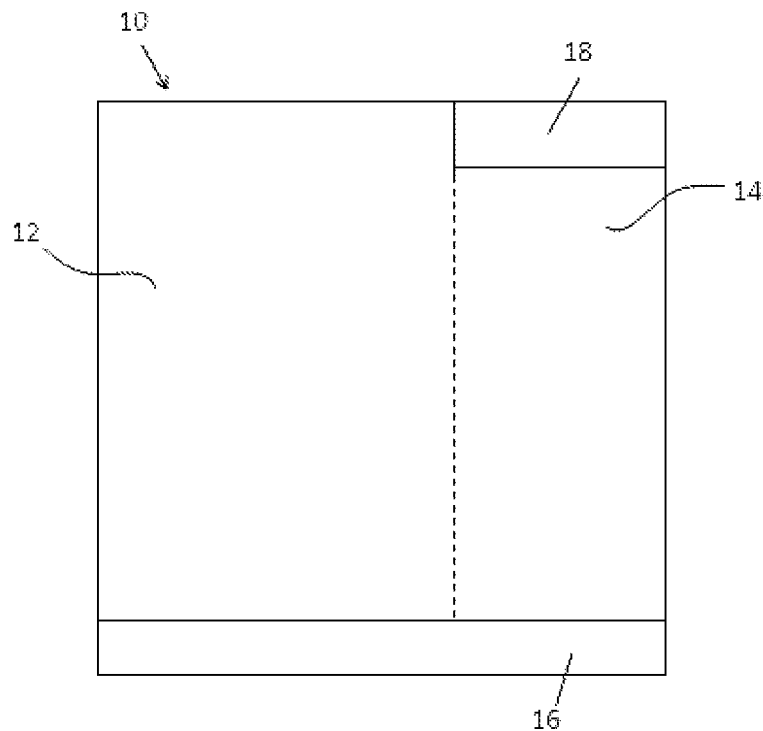
FIG. 1 is a schematic view of a shelf of a network device according to an implementation manner of the present disclosure.

The following clearly describes the technical solutions in the implementation manners of the present disclosure with reference to the accompanying drawings in the implementation manners of the present disclosure. Arrows in the drawings represent a route of a flow direction of an airflow.

Figure 2:
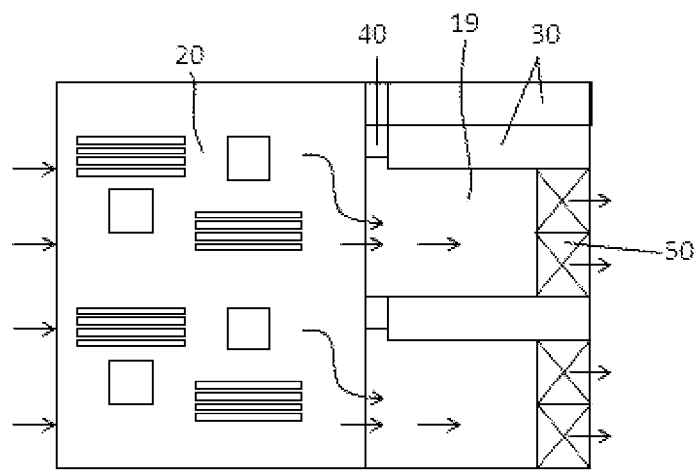
FIG. 2 is a schematic plane view of the network device according to an implementation manner of the present disclosure, where an arrow represents a direction in which an airflow flows in a first heat dissipation channel.
Figure 3:
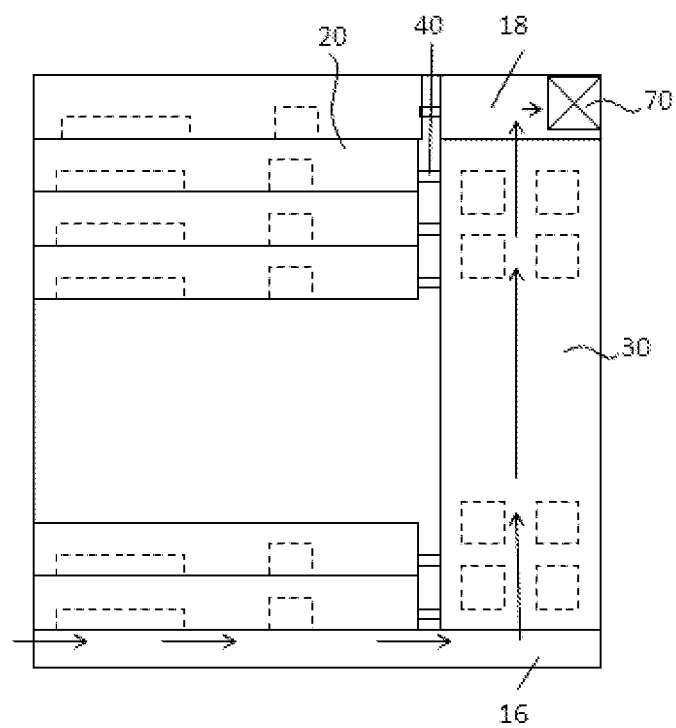
FIG. 3 is a schematic plane view of another direction of the network device according to an implementation manner of the present disclosure, where an arrow represents a direction in which an airflow flows in a second heat dissipation channel.

The present disclosure relates to a network device. As shown in FIG. 1 to FIG. 3, the network device includes a shelf 10, at least one front board module 20, at least one rear board module 30, a first fan 50, and a second fan 70.

The network device includes a server, a switch, a router, and the like.

Referring to FIG. 1, a first accommodation area 12, a second accommodation area 14, a first channel 16, and a second channel 18 are disposed in the shelf 10, the first accommodation area 12 and the second accommodation area 14 are respectively close to a front end and a rear end of the shelf 10 and communicate with each other, the first channel 16 and the second channel 18 are separately located on two sides of the second accommodation area 14, and the first channel 16 and the second channel 18 are both isolated from the first accommodation area 12 and the second accommodation area 14. Isolation plates are disposed in the shelf 10, so that the first channel 16 and the second channel 18 are both isolated from the first accommodation area 12 and the second accommodation area 14. In an implementation manner, the first channel 16 is disposed at the bottom of the shelf 10, and the second channel 18 is disposed on the top of the shelf 10.

Referring to FIG. 2 and FIG. 3, the front board module 20 is disposed in the first accommodation area 12, the rear board module 30 is disposed in the second accommodation area 14, and the front board module 20 and the rear board module 30 are electrically connected. A third channel 19 is further disposed in the shelf 10, the third channel 19 is disposed between the two adjacent rear board modules 30 or between the rear board module 30 and the shelf 10, and the third channel 19 communicates with the first accommodation area 12. The front board module 20 and the rear board module 30 are distributed in the shelf 10 in an orthogonal manner, the front board module 20 is horizontally placed in a stack-up manner, and the rear board module 30 is vertically placed in the stack-up manner. The third channel 19 communicates with the first accommodation area 12, that is, after flowing through the front board module 20, an airflow may directly enter the third channel 19.

The first fan 50 and the second fan 70 are both disposed at the rear end of the shelf 10, the first fan 50 faces the third channel 19, and the second fan 70 faces the second channel 18. When the first fan 50 and the second fan 70 work, an airflow is generated in the shelf 10, and the airflow flows from the front end of the shelf 10 to the rear end of the shelf 10, to dissipate heat from the front board module 20 and the rear board module 30 in the shelf 10.

The third channel 19 may be distributed between every two adjacent rear board modules 30, and in this arrangement, there is a large quantity of third channels 19, and correspondingly, there is a large quantity of first fans 50, so that the heat dissipation effect is good. This design is suitable for a case in which heat dissipation of the front board module 20 needs to be enhanced. In another implementation manner, if the front board module 20 does not need strong heat dissipation, a few third channels 19, for example, one or two third channels 19, may be retained, and are disposed between two adjacent rear board modules 30. Other rear board modules 30 are disposed in an overlapping manner, and in this way, more rear board modules 30 can be disposed in limited space, thereby improving utilization of the space.

An airflow sequentially passes, from the front end of the shelf 10, through the front board module 20 in the first accommodation area 12, the third channel 19, and the first fan 50 to form a first heat dissipation channel. The first channel 16 and the second channel 18 both communicate with internal space of the rear board module 30. An airflow sequentially passes through the inside of the rear board module 30, the second channel 18, and the second fan 70 after entering the first channel 16 from the outside of the shelf 10, to form a second heat dissipation channel. The first heat dissipation channel and the second heat dissipation channel are independent of each other.

In the network device provided in the present disclosure, a first fan 50 is used for separately dissipating heat from a front board module 20, a first heat dissipation channel and a second heat dissipation channel are designed to be independent of each other, and a second fan 70 separately dissipates heat from a rear board module 30 and has a good heat dissipation capability, so that the rear board module 30 can work in an environment with an appropriate temperature, thereby improving a service life of the rear board module 30, and further ensuring reliability of the network device.

In an implementation manner, the first channel 16 extends from the front end of the shelf 10 to one side of the rear board module 30, and the second channel 18 extends from the other opposite side of the rear board module 30 to the second fan 70 located at the rear end of the shelf 10.

Figure 5:
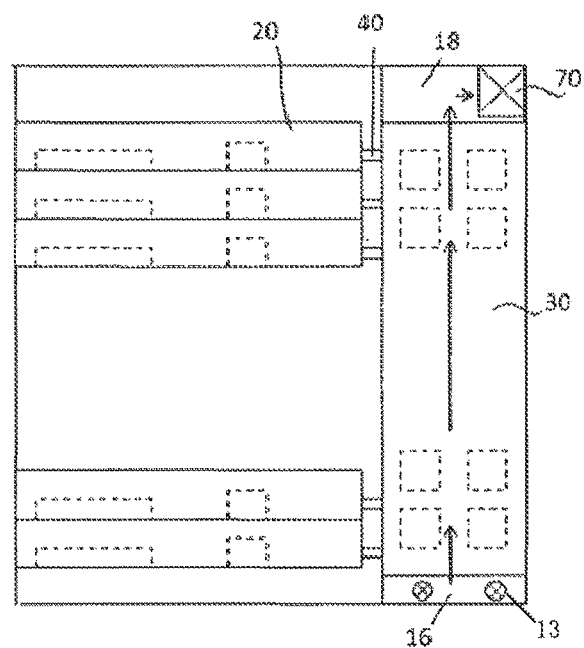
FIG. 5 is a schematic view of the network device according to an implementation manner of the present disclosure, where an arrow represents a direction in which an airflow flows in a second heat dissipation channel.

In another implementation manner, the shelf 10 is provided with a ventilation opening 13 (shown in FIG. 5), the ventilation opening 13 is disposed on a side surface of the bottom of the second accommodation area 14 of the shelf 10, the ventilation opening 13 enables the second accommodation area 14 to directly communicate with the outside of the shelf 10, and the first channel 16 is located between the ventilation opening 13 and the rear board module 30. Referring to FIG. 5, in this implementation manner, arrangement of a ventilation opening 13 can shorten the first channel 16. After entering the ventilation opening 13, an external airflow can enter the inside of the rear board module 30 in the shortest time, which helps improve a heat dissipation capability.

Figure 4:
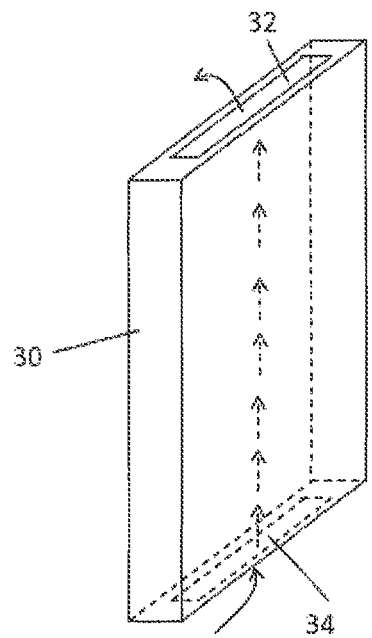
FIG. 4 is a schematic view of a rear board module of the network device according to an implementation manner of the present disclosure.

A specific structure of the rear board module 30 in the present disclosure is that, referring to FIG. 4, each rear board module 30 includes a housing and a circuit board accommodated in the housing, the housing is provided with an air inlet 34 and an air outlet 32, the air inlet 34 faces the first channel 16, the air outlet 32 faces the second channel 18, and the housing isolates the circuit board from the second accommodation area 14. Internal space of the housing is used as a part of the second heat dissipation channel, so that an airflow can enter the housing, and directly dissipate heat from a heat emitting element on the circuit board.

In an implementation manner, a connection manner between the front board module 20 and the rear board module 30 is that the network device further includes at least one orthogonal connector 40, and the orthogonal connector 40 is connected between the front board module 20 and the rear board module 30, to implement data transmission between the front board module 20 and the rear board module 30.

In another implementation manner, a connection manner between the front board module 20 and the rear board module 30 is that the network device further includes a backplane (not shown in the figure), the backplane is used to implement an electrical connection between the front board module 20 and the rear board module 30, the backplane is provided with an air guiding opening, and the first accommodation area 12 communicates with the third channel 19 by using the air guiding opening.

Because the front board module 20 and the rear board module 30 are connected by using the orthogonal connector 40 or the backplane having the air guiding opening, an airflow directly enters the third channel 19 from the front board module 20 without being blocked, so that the first heat dissipation channel is simple, thereby improving a heat dissipation capability.

In an implementation manner of the present disclosure, the front board module 20 is a line processing unit, and the rear board module 30 is a fabric board, the first heat dissipation channel for dissipating heat from the line processing unit and the second heat dissipation channel for dissipating heat from the fabric board are independent of each other. The first heat dissipation channel is in a straight shape, an airflow directly flows from the front end of the shelf 10 to the first fan 50 at the rear end. The second heat dissipation channel is approximately in an L shape, or is a shape combining the L shape and the straight shape. The first heat dissipation channel and the second heat dissipation channel are both simple, and help improve the heat dissipation capability.

The foregoing descriptions are exemplary implementation manners of the present disclosure. It should be noted that a person of ordinary skill in the art may make certain improvements and polishing without departing from the principle of the present disclosure and the improvements and polishing shall fall within the protection scope of the present disclosure.

What is claimed is:

1. A network device, comprising:
   a shelf comprising a front end, a rear end, a side surface, a top, a bottom, a first accommodation area, a second accommodation area, a first channel, a second channel, a third channel, and a ventilation opening, the first accommodation area being closer to the front end than the rear end, the second accommodation area being closer to the rear end than the front end, the first channel and the second channel being separately located on two sides of the second accommodation area, the first channel and the second channel both being physically isolated from the first accommodation area and the second accommodation area, the ventilation opening being disposed on the side surface closer to the bottom than the top, and the ventilation opening enabling the second accommodation area to draw air from outside of the shelf;
   multiple front board modules disposed in the first accommodation area;
   multiple rear board modules disposed in the second accommodation area, the multiple front board modules and the multiple rear board modules being electrically connected and distributed in the shelf in an orthogonal manner with respect to each other, the third channel being disposed between two adjacent rear board modules, and the first channel being located between the ventilation opening and the rear board module;
   a first fan disposed at the rear end and facing the third channel, a first airflow sequentially passing from the front end of the shelf, through the first accommodation area, through the third channel, and to the first fan to form a first heat dissipation channel for heat dissipation of the multiple front board modules; and
   a second fan disposed at the rear end of the shelf and facing the second channel, a second airflow from outside of the shelf entering the first channel via the ventilation opening and sequentially passing through the second accommodation area, through the second channel, and to the second fan to form a second heat dissipation channel for heat dissipation of the multiple rear board modules, and the first heat dissipation channel and the second heat dissipation channel bring physically independent of each other.

2. The network device according to claim 1, wherein each of the rear board modules comprises:
   a housing comprising an internal space, an air inlet, and an air outlet, the air inlet facing the first channel, and the air outlet facing the second channel; and
   a circuit board accommodated in the housing, the housing isolating the circuit board from the second accommodation area, and the internal space being a part of the second heat dissipation channel.

3. The network device according to claim 2, wherein the network device further comprises multiple orthogonal connectors connected between the multiple front board modules and the multiple rear board modules to implement data transmission between the multiple front board modules and the multiple rear board modules.

4. The network device according to claim 2, wherein the network device further comprises a backplane used to implement an electrical connection between the front board modules and the rear board modules, the backplane comprising air guiding openings, and the first accommodation area coupled to the third channel using the air guiding openings.

* * * * *